United States Patent
Sheu et al.

(10) Patent No.: US 8,551,835 B2
(45) Date of Patent: Oct. 8, 2013

(54) ELECTROSTATIC DISCHARGE PROTECTION DEVICE AND METHOD

(71) Applicant: Taiwan Semiconductor Manufacturing Company, Ltd., Hsin-Chu (TW)

(72) Inventors: Ming-Song Sheu, Hsin-Chu (TW); Jian-Hsing Lee, Hsin-Chu (TW); Yao-Wu Feng, Miao-Li Hsien (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/769,650

(22) Filed: Feb. 18, 2013

(65) Prior Publication Data

US 2013/0157430 A1  Jun. 20, 2013

Related U.S. Application Data

(62) Division of application No. 12/609,803, filed on Oct. 30, 2009, now Pat. No. 8,378,422.

(60) Provisional application No. 61/150,542, filed on Feb. 6, 2009.

(51) Int. Cl.
 *H01L 21/8249* (2006.01)

(52) U.S. Cl.
 USPC ............ 438/234; 438/202; 438/210

(58) Field of Classification Search
 USPC ............... 438/200, 202, 210, 234
 See application file for complete search history.

(56) References Cited

U.S. PATENT DOCUMENTS

| | | | | |
|---|---|---|---|---|
| 5,541,123 A * | 7/1996 | Williams et al. | | 438/202 |
| 7,476,945 B2 * | 1/2009 | Yamada | | 257/401 |
| 7,763,908 B2 * | 7/2010 | Chen | | 257/107 |
| 7,808,069 B2 * | 10/2010 | Ho et al. | | 257/484 |
| 8,049,307 B2 * | 11/2011 | Jou et al. | | 257/556 |
| 2004/0110353 A1 * | 6/2004 | Mallikarjunaswamy | | 438/309 |
| 2008/0157196 A1 * | 7/2008 | Jang | | 257/338 |
| 2008/0308874 A1 * | 12/2008 | Letavic et al. | | 257/369 |

* cited by examiner

*Primary Examiner* — Kevin M Picardat
(74) *Attorney, Agent, or Firm* — Slater & Matsil, L.L.P.

(57) ABSTRACT

Embodiments of the invention relate to an electrostatic discharge (ESD) device and method for forming an ESD device. An embodiment is an ESD protection device comprising a p well disposed in a substrate, an n well disposed in the substrate, a high voltage n well (HVNW) disposed between the p well and the n well in the substrate, a source n+ region disposed in the p well, and a plurality of drain n+ regions disposed in the n well.

20 Claims, 9 Drawing Sheets

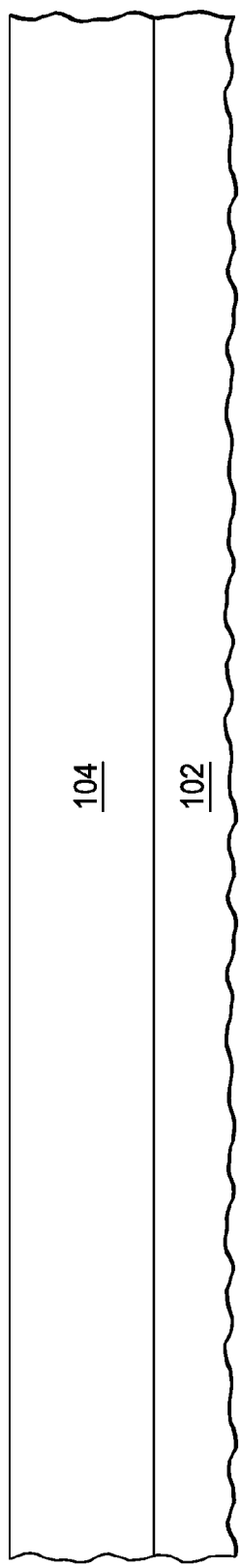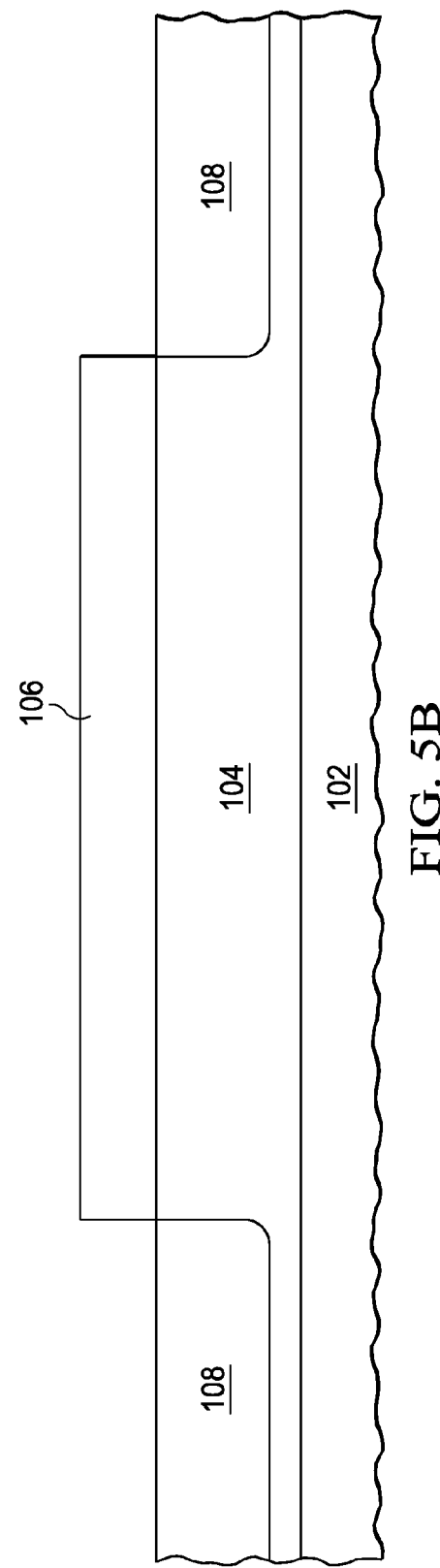

ELECTROSTATIC DISCHARGE PROTECTION DEVICE AND METHOD

This application is a divisional of U.S. patent application Ser. No. 12/609,803, filed Oct. 30, 2009, which claims the benefit of U.S. Provisional Patent Application Ser. No. 61/150,542, filed on Feb. 6, 2009, and entitled "Electrostatic Discharge Protection Device and Method," which application is incorporated herein by reference.

TECHNICAL FIELD

This invention relates generally to electrostatic discharge (ESD) protection devices and methods, and more particularly to ESD protection devices protecting high voltage semiconductor devices and methods for forming an ESD protection device.

BACKGROUND

Static charge can result in extremely high voltages near an integrated circuit that can lead to the integrated circuit being subjected to an electrostatic discharge (ESD) event. When electrostatic energy is discharged, a high current can be produced through devices of the integrated circuit. For example, when a person carrying a static charge touches a pin of a package of the integrated circuit, a discharge of the static charge onto the integrated circuit can cause a high voltage and a high current to be generated to an input or output buffer of the integrated circuit. ESD is a serious problem for semiconductor devices since it has the potential to destroy the device and the entire integrated circuit.

ESD protection devices are generally integrated into integrated circuits. An ESD protection device can provide a current path so that when an ESD transient occurs, the ESD current is conducted through the ESD protection device without going through the devices being protected. High voltage N well (HVNW) devices are conventionally used in ESD protection devices, particularly for protecting high voltage semiconductor devices.

SUMMARY OF THE INVENTION

In accordance with an embodiment of the present invention, an electrostatic discharge (ESD) protection device comprises a p well disposed in a substrate, an n well disposed in the substrate, a high voltage n well (HVNW) disposed between the p well and the n well in the substrate, a source n+ region disposed in the p well, and a plurality of drain n+ regions disposed in the n well.

In accordance with another embodiment of the present invention, a drain for an ESD device, the drain comprises a doped well, a plurality of highly doped areas within the doped well, and a plurality of contacts. Each highly doped area is physically isolated from all other highly doped areas, and at least one contact is electrically coupled to each highly doped area.

In accordance with another embodiment of the present invention, a method of forming an electrostatic discharge device, the method comprises forming a p well in a semiconductor substrate, forming a high voltage n well in the semiconductor substrate, forming a deep n well in the high voltage n well, and forming n+ regions in the deep n well.

An advantage of embodiments of the present invention is that current flowing through the ESD device can distribute more uniformly throughout contacts in the drain. This prevents current crowding in certain contacts that could lead to thermal fatigue and device failure.

BRIEF DESCRIPTION OF THE DRAWINGS

For a more complete understanding of the present invention, and the advantages thereof, reference is now made to the following descriptions taken in conjunction with the accompanying drawing, in which:

FIGS. 5A through 5J are a process for building an electrostatic discharge device in accordance with an embodiment.

DETAILED DESCRIPTION OF ILLUSTRATIVE EMBODIMENTS

The making and using of the present embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely an ESD protection device.

Figure 1:
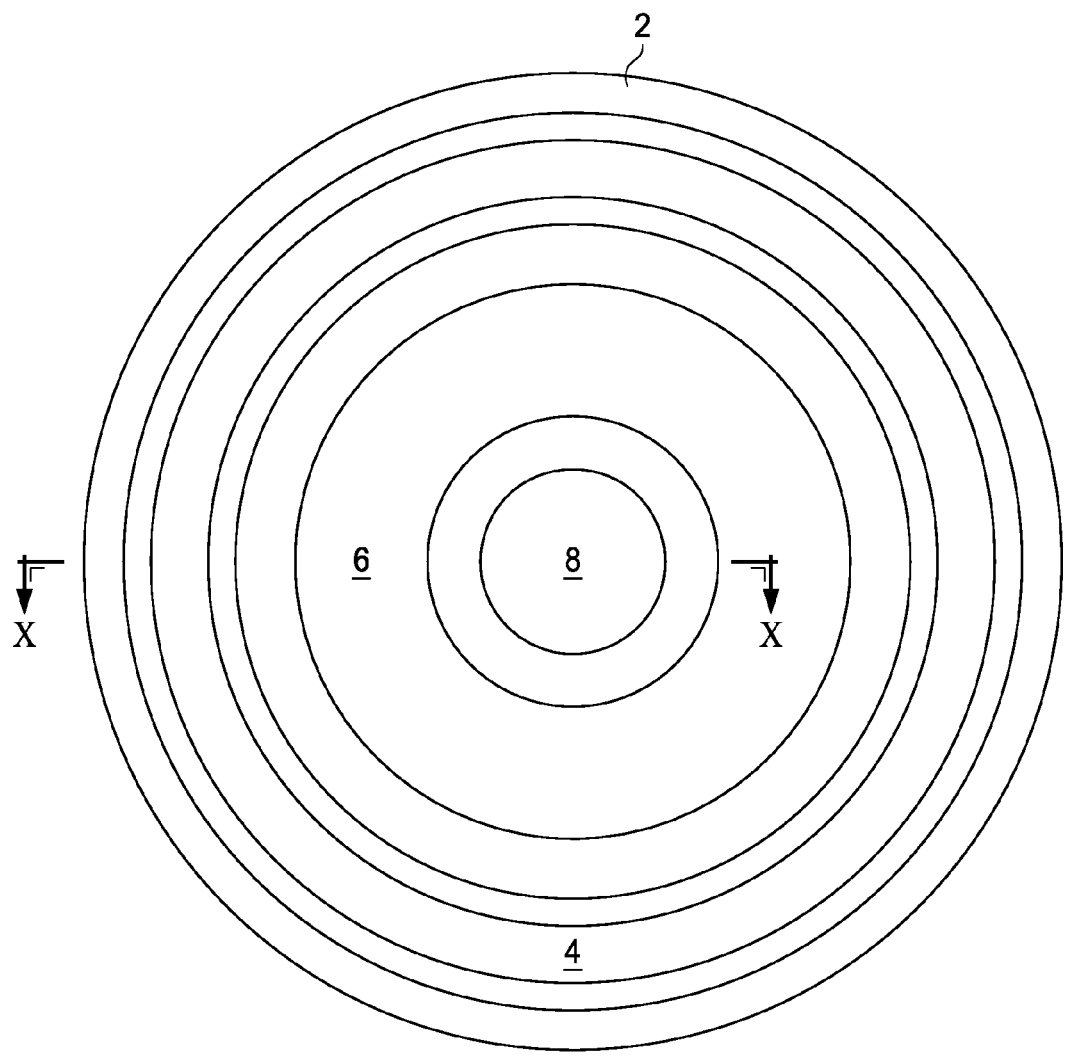
FIG. 1 is a layout of a conventional HVNW device.

FIG. 1 shows a conventional HVNW device. A p+ doped guard-ring 2 surrounds the circular device. Inside of the guard-ring 2 is an n+ doped source 4. Inside the source 4 is the high voltage N well (HVNW) 6 and then the n+ doped drain 8.

Figure 2:
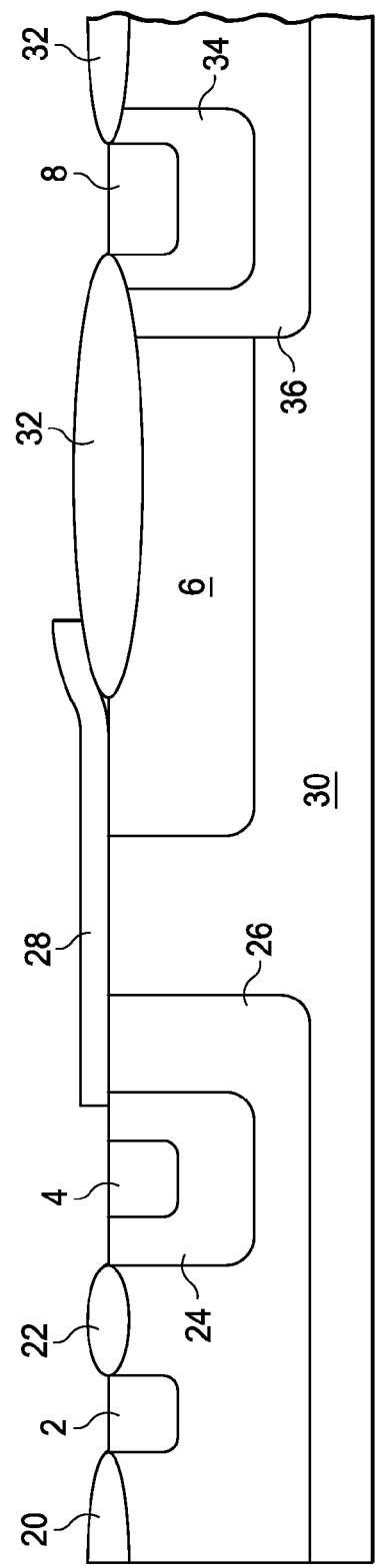
FIG. 2 is a cross-sectional view of the conventional HVNW device.

FIG. 2 is a cross-sectional view of the conventional device in FIG. 1 along line X-X. Two field oxides 20 and 22 isolate the guard-ring 2. The source 4 is in an n drain diffuse region 24. Both the guard-ring 2 and the n doped region 24 are in a p doped well 26. A gate structure 28 above the substrate 30 extends from the inner edge of the n doped region 24 to and partially covering another field oxide 32. Part of the gate 28 and the field oxide 32 cover the HVNW 6. The field oxide 32 extends to the outer edge of the drain 8. The drain 8 is in an n drain diffuse region 34 within an n well 36. The n well 36 extends to the HVNW 6.

Generally, the conventional device is electrically coupled between input/output pads of the integrated circuit. When a transient occurs, the device activates and conducts current away from other devices on the integrated circuit.

Figure 3A:
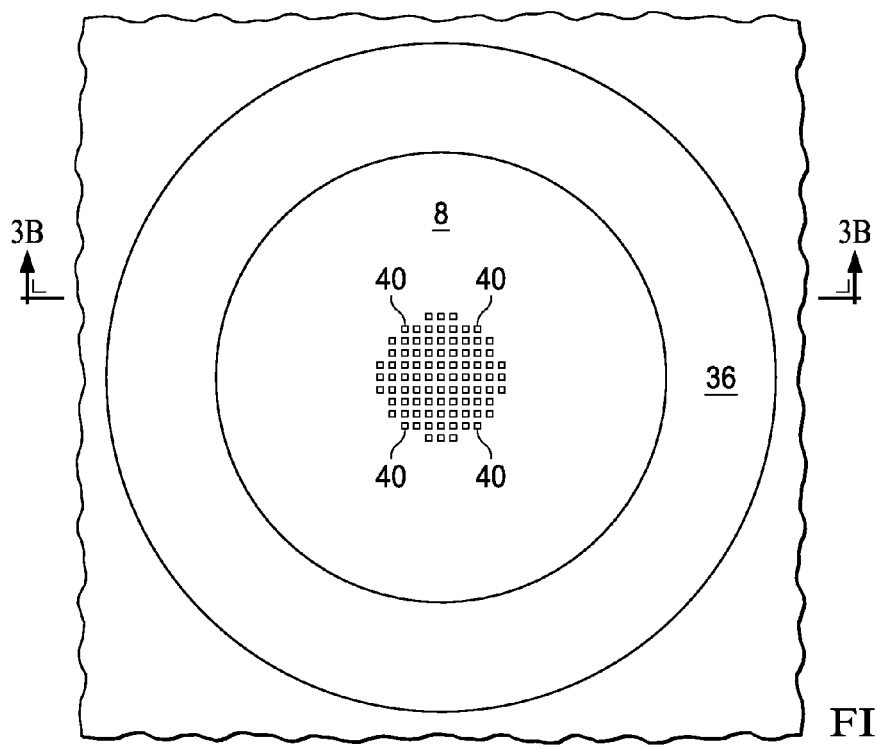
FIG. 3A is a plan view of the drain of the conventional HVNW device.
Figure 3B:
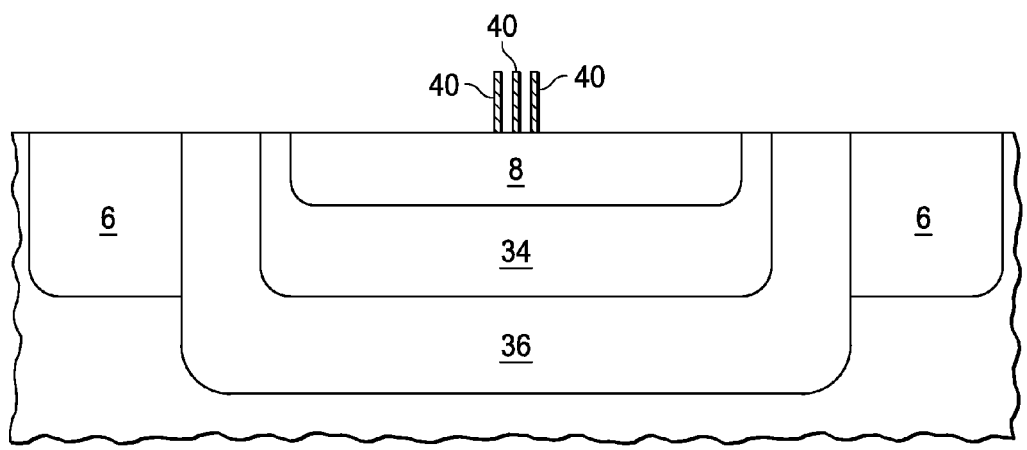
FIG. 3B is a cross-sectional view of the drain of the conventional HVNW device.

FIGS. 3A and 3B are views of the drain 8 of the conventional device. FIG. 3A is a plan view of the drain 8. FIG. 3B is a cross-sectional view of the drain 8. In both figures, the n+ doped drain 8 is made up of one n+ doped region with multiple contacts 40. The contacts 40 are tightly concentrated in the center of drain 8. Typically, the contacts 40 are concentrated within an area of having a diameter of about 12 micrometers in the drain 8 that has a diameter of about 50 micrometers.

As will be discussed in more detail below, the concentration of the contacts 40 within a single n+ doped region can result in current crowding in contacts 40 near the edge of the grouping. The paths between contacts near the edge of the group and the source have a lower resistance than paths between inner contacts and the source. Thus, more current will generally flow through the outer contacts. The increase in current flow through the outer contacts can lead to thermal failure of those contacts that will eventually result in total device failure.

Figure 4A:
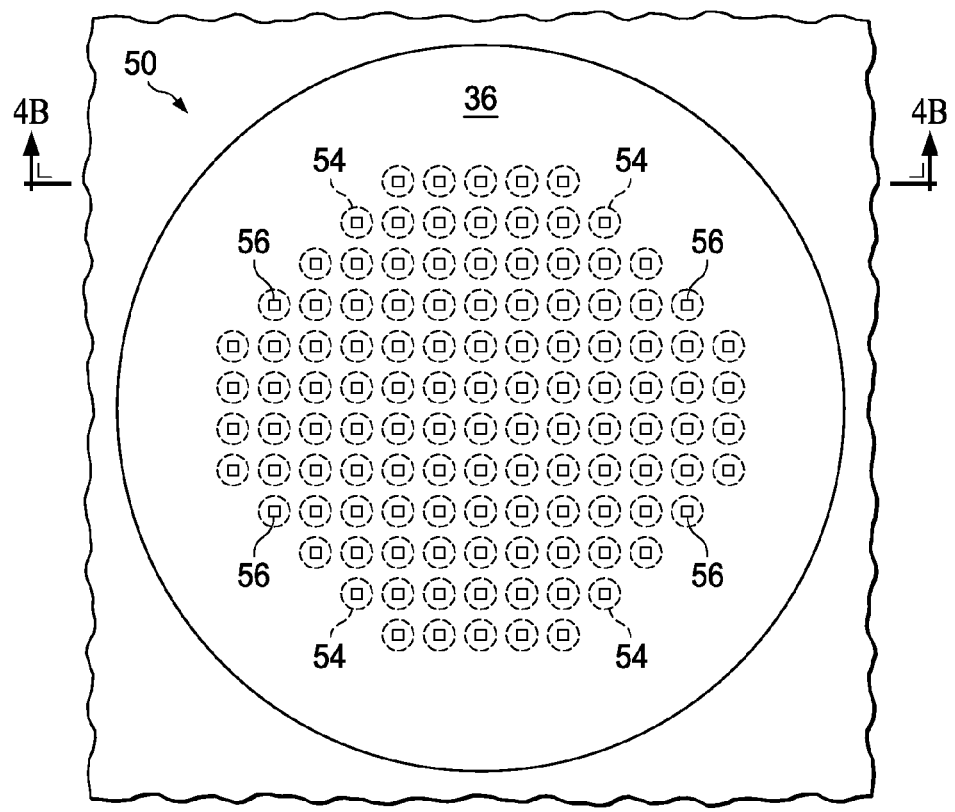
FIG. 4A is a plan view of a drain of an electrostatic discharge device in accordance with an embodiment.
Figure 4B:
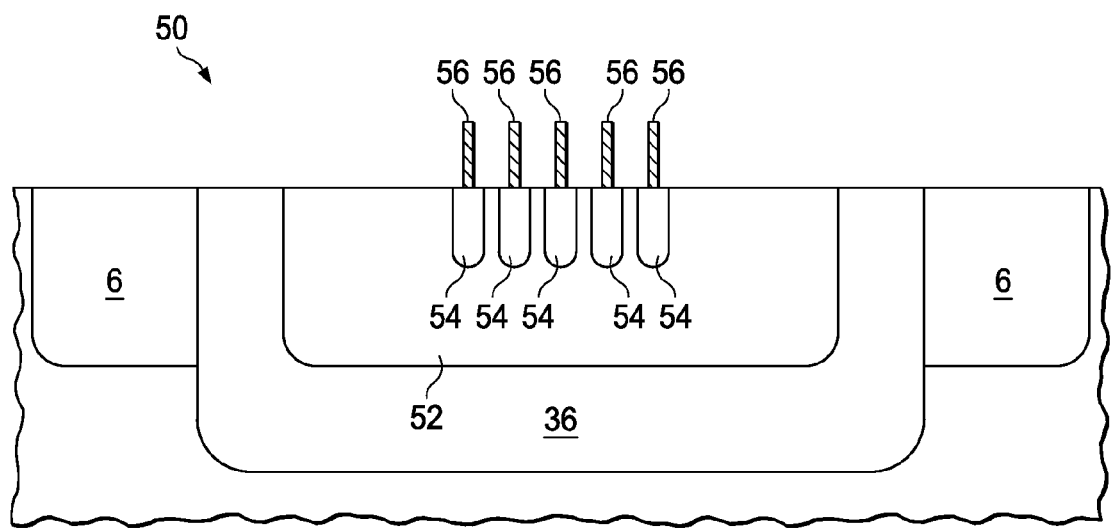
FIG. 4B is a cross-sectional view of the drain of an electrostatic discharge device in accordance with an embodiment.

FIGS. 4A and 4B are views of an embodiment of the invention. FIG. 4A is a plan view of a drain 50, and FIG. 4B is a cross-sectional view of the drain 50. In both figures, within the n drain diffuse region 52 are multiple n+ doped regions 54 that compose the drain 50. Each n+ doped region 54 has a contact 56. Each n+ doped region 54 has a diameter of approximately 2.5 micrometers, and the n well 36 has a diameter of approximately 75 micrometers, or in other words, areas of approximately 4.91 square micrometers and 4,420 square micrometers, respectively. However, a person of ordinary skill in the art will know that these measurements may be increased or decreased according to the technical requirements of the application.

Further, an embodiment of this invention has approximately one hundred n+ doped regions 54, although this may also be varied. These n+ doped regions 54 are concentrated in an area of approximately 2,200 square micrometers centrally located within the n well 36. Each n+ doped region 54 has edges that are at least approximately one micrometer from all edges of other n+ doped regions 54. Therefore, at least approximately one micrometer space acts as a buffer between all of the n+ doped regions 54. Accordingly, the concentration of the n+ doped regions 54 is approximately one per 19 square micrometers within the n well. Although the foregoing dimensions have been discussed with regard to a specific embodiment, a person having ordinary skill in the art will understand that the dimensions may be varied according to any specific application and still remain within the scope of the invention.

By creating multiple individual n+ doped regions 54 with each one having a contact 56, embodiments may take advantage of a characteristic of the general n+ doped region or drain to avoid excess current flow through outer contacts that could damage the contacts. Generally, as the current flow increases through an n+ doped region or drain, the resistance also increases within the n+ doped region or drain. Further, it is generally known that the distance between two contacts can affect the resistance between the two contacts; particularly within a semiconductor device, a longer distance usually causes a larger resistance between two contacts assuming all junctions or other variables are equal.

Accordingly, for the conventional device in FIGS. 3A and 3B, the resistance between the n+ doped source 4 is the smallest to the outer contacts closest to the n+ doped source 4 of the current. Because all of the contacts 40 are within the single n+ doped drain 8, all other variables are equal, and the conventional device cannot advantageously use the resistance characteristic of the n+ doped drain 8 to affect the current flowing through each contact 40 because the n+ doped drain 8 is common to all contacts 40. Therefore, when an ESD event occurs and current flows to the n+ doped drain 8, the outer contacts 40 are likely to receive high amounts of current because of the lowest resistance path, and those contacts 40 may fail due to thermal failure of the contact caused by the high current.

However, embodiments contain multiple n+ doped regions 54 with each having a contact 56. Because of this, each n+ doped region 54 may effectively clamp the current through each contact 56. Before an ESD event occurs, usually the n+ doped regions 54 do not determine which contact 56 has the least resistance to the source, but rather, the distance between the source and each contact 56 determines which contact 56 has the least resistance. Accordingly, at the onset of an ESD event, current is more likely to flow through the n+ doped regions 54 and contacts 56 of the outer most contacts 56. But as the current flow increases through those n+ doped regions 54, the resistance of the n+ doped region 54 through which the current flows increases. From this, the resistance of the outer contacts 56 increases to a point where the resistance through the outer contacts is greater than some inner contacts 56. Thus, current will begin to flow through the inner contacts 56. This can be done because of the separate n+ doped regions 54 for each contact 56. By separating the n+ doped regions 54, the resistance characteristic for a single contact 56 can operate independently from other contacts 56. Contrast this to the conventional device, this characteristic could not be exploited because the resistance of the n+ doped drain 8 did not operate independently for differing contacts 40. Therefore, embodiments allow current to flow through the contacts 56 more uniformly to decrease the risk of thermal failures of those contacts 56.

Figure 5C:
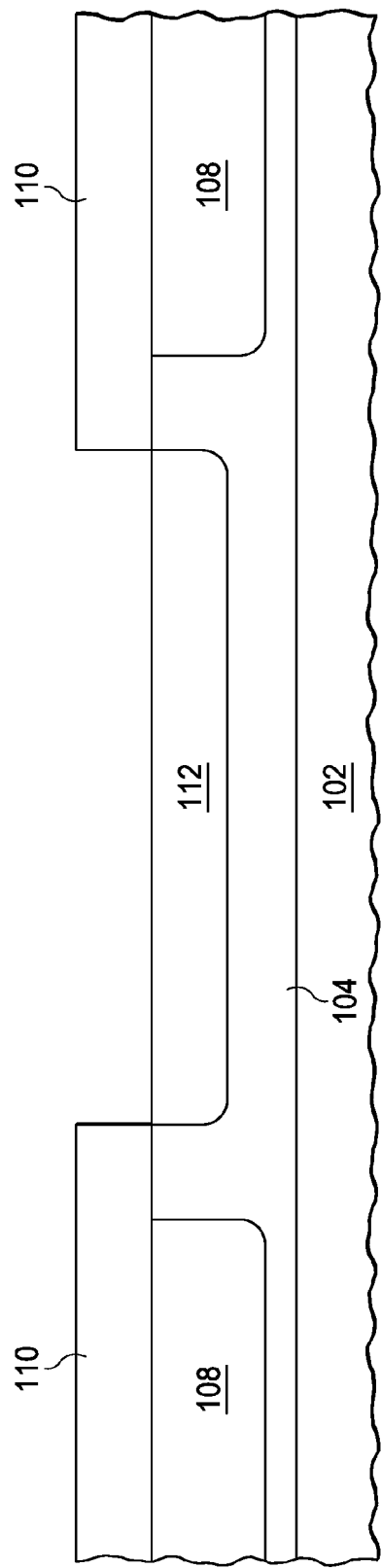

FIGS. 5A through 5J illustrate a process for building an ESD device in accordance with embodiments of the invention. In FIG. 5A, an epitaxial substrate 104 is formed on a substrate 102. In FIG. 5B, a resist layer 106 is patterned to expose an area of the epitaxial substrate where a p well 108 is to be formed. The epitaxial substrate 104 is doped with p type dopants to form the p well 108, and the resist layer 106 is removed. In FIG. 5C, a resist layer 110 is patterned on the epitaxial substrate 104 to expose an area of the epitaxial substrate 104 where a HVNW 112 is to be formed. The epitaxial substrate is doped with n type dopants to form the HVNW 112. Then, the resist layer 110 is removed.

Figure 5D:
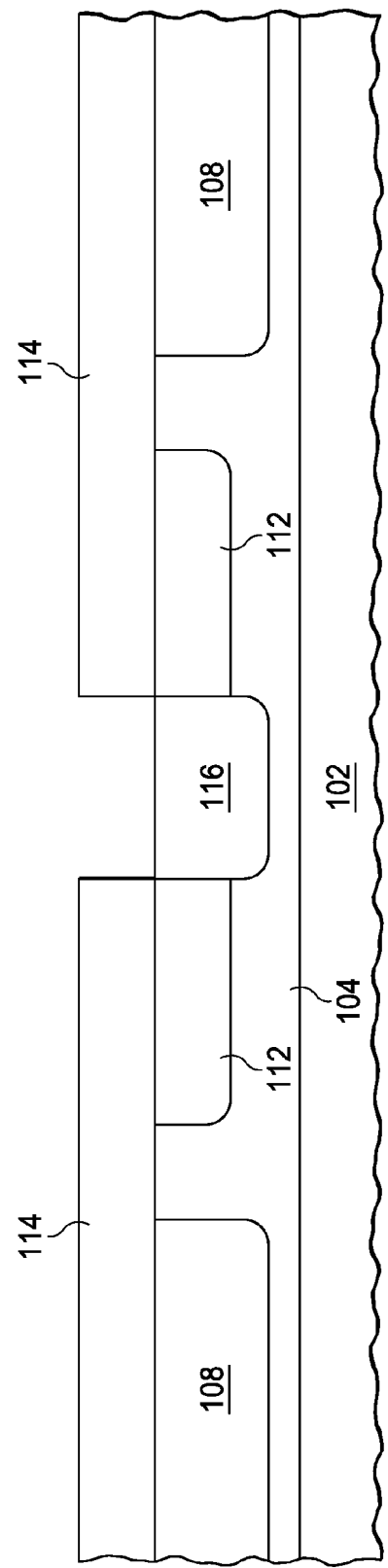

In FIG. 5D, a resist layer 114 is formed exposing an area of the epitaxial substrate 104 where a deep n well 116 is to be formed. The epitaxial substrate 104 is then doped using n type dopants to form the deep n well 116.

Figure 5E:
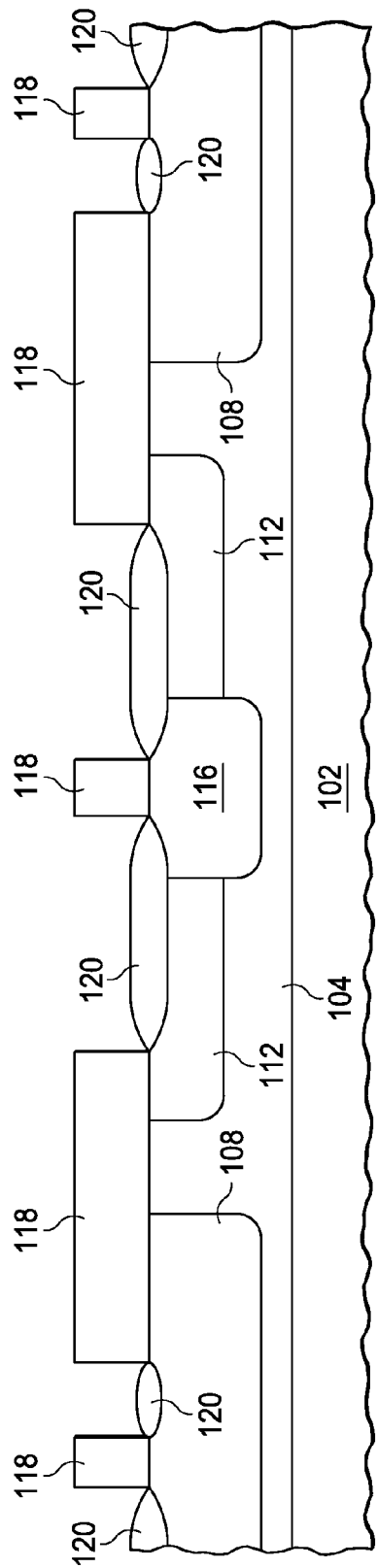

In FIG. 5E, field oxides 120 are formed on the epitaxial substrate 104 in areas exposed by a hardmask layer 118. The field oxides 120 could alternatively be shallow trench isolations (STIs).

Figure 5F:
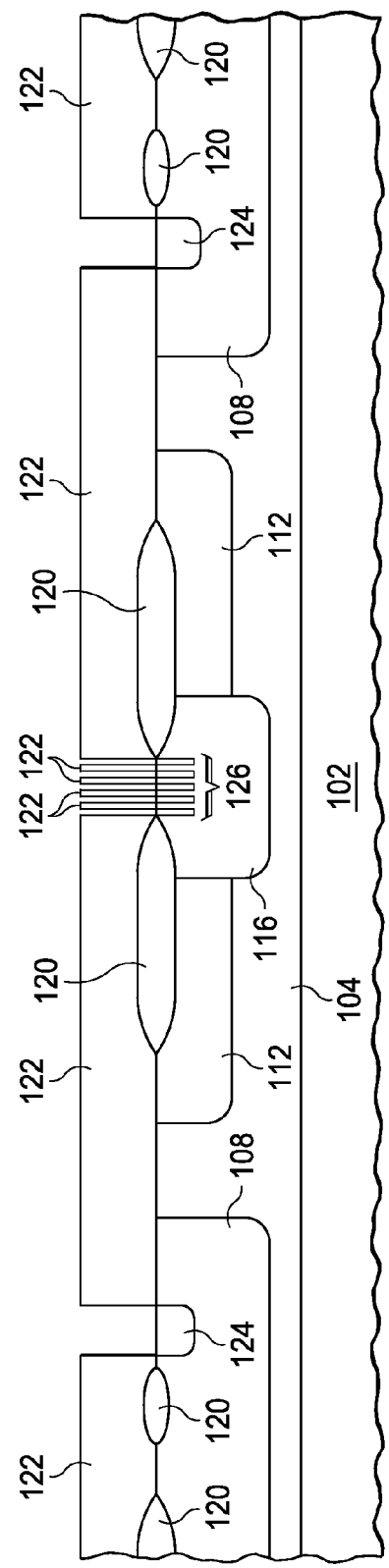
Figure 5G:
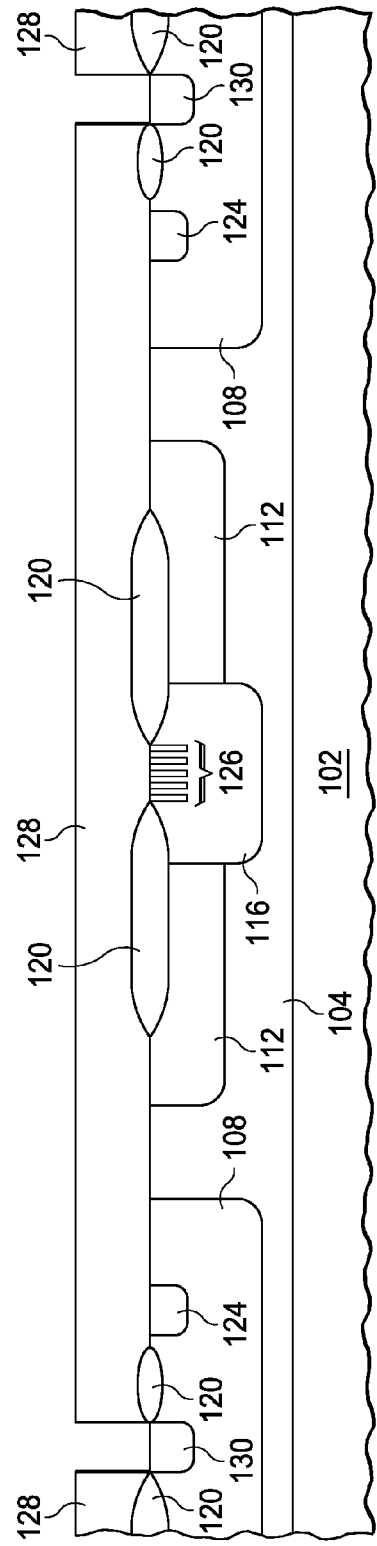

In FIG. 5F, another resist layer 122 is patterned on the epitaxial substrate to expose a portion of the p well 108 and a portion of the deep n well 116. The exposed deep n well 116 area consists of multiple areas distributed throughout the surface of the deep n well 116. N type dopants are then added to create an n+ region 124 in the p well 108 and multiple n+ regions 126 in the deep n well 116. In FIG. 5G, a resist layer 128 is patterned to expose an area of the p well 108 where a p+ region 130 is to be formed. The area is then doped using p type dopants.

Figure 5H:
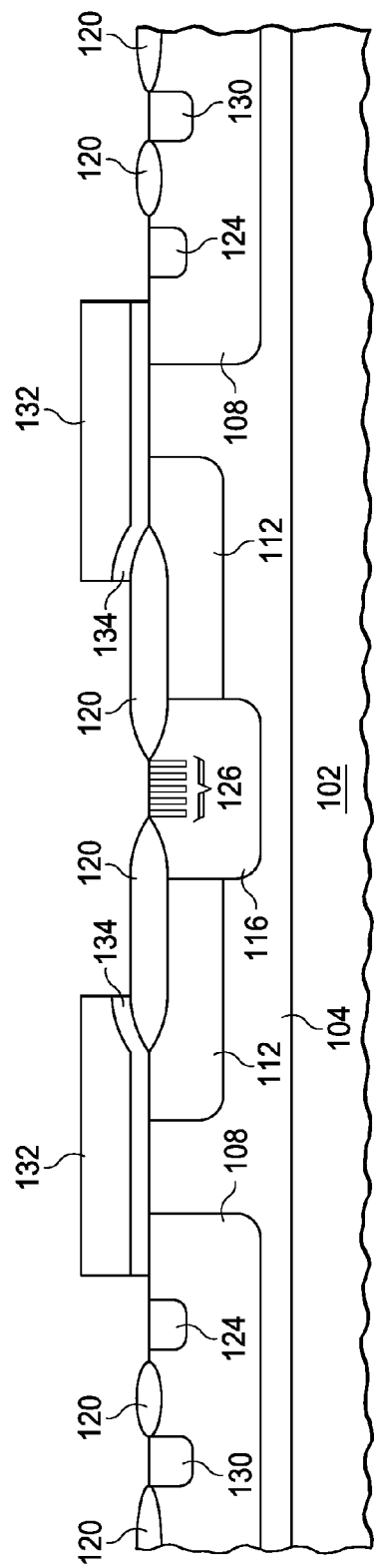

FIG. 5H illustrates a dielectric layer (not shown) formed on the epitaxial substrate 104 and a polysilicon layer (not shown) formed on the dielectric layer. A hardmask layer 132 is patterned to cover an area of the polysilicon layer where a gate structure will be formed. The polysilicon layer and dielectric layer are then etched to form the gate structure 134 on the epitaxial substrate 104. Other processes known in the art to form the gate structure 134 may also be used.

Figure 5I:
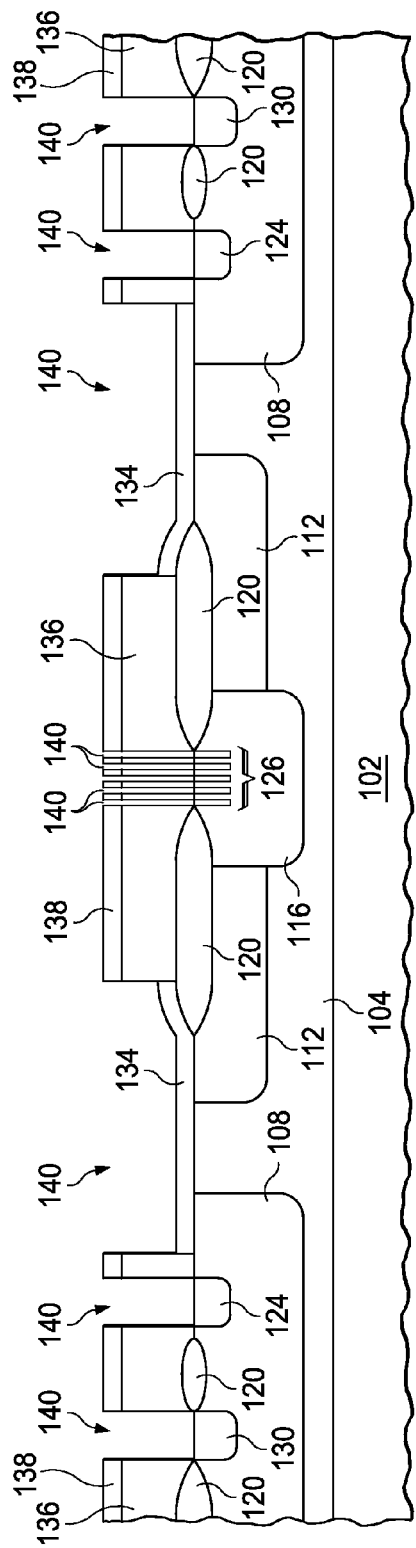
Figure 5J:
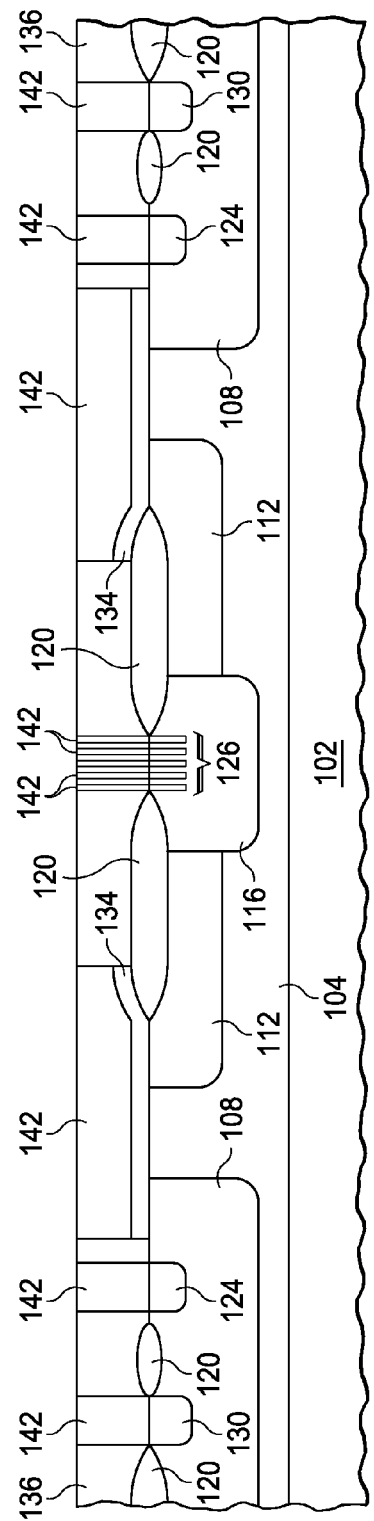

In FIG. 5I, the hardmask layer 132 is removed, and a dielectric layer 136 is formed over the epitaxial substrate 104. A hardmask 138 is formed on the dielectric layer 136 and patterned to expose areas of the dielectric layer 136 where contacts will be formed. The dielectric layer 136 is then etched to form openings 140, and the hardmask 138 is removed. As shown in FIG. 5J, the openings in the dielectric layer 136 are then filled with metal to form contacts 142, and any excess metal is removed by polishing, such as by chemical mechanical polishing.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
    forming a p well in a semiconductor substrate;
    forming a high voltage n well in the semiconductor substrate;
    forming a deep n well in the high voltage n well; and
    forming n+ regions in the deep n well.

2. The method of claim 1, wherein forming n+ regions in the deep n well comprises:
    forming a resist layer over the semiconductor substrate such that the resist layer has a plurality of openings over the deep n well; and
    implanting n type impurities into the deep n well.

3. The method of claim 1, further comprising forming a contact electrically coupled to each n+ region.

4. The method of claim 3, wherein the forming the contact to each n+ region comprises:
    forming a dielectric layer over the substrate;
    patterning a hardmask over the dielectric layer such that an area of the dielectric layer above each n+ region is exposed;
    etching the dielectric layer; and
    depositing conductive material on the substrate.

5. The method of claim 1, further comprising:
    forming a p+ region in the p well; and
    forming a gate structure on the semiconductor substrate.

6. A method of forming a semiconductor device, the method comprising:
    forming a drain region, the drain region having dopants of a first conductivity type;
    forming a plurality of highly doped regions in the drain region, the plurality of highly doped regions having a higher concentration of dopants of the first conductivity type than the drain region; and
    forming a plurality of contacts, wherein at least two of the plurality of contacts are electrically coupled to different ones of the plurality of highly doped regions.

7. The method of claim 6, wherein the plurality of highly doped regions are entirely within the drain region.

8. The method of claim 6, further comprising forming a high voltage well, wherein the drain region is within the high voltage well.

9. The method of claim 8, wherein the drain region extends lower than a lower surface of the high voltage well.

10. The method of claim 8, further comprising forming an outer well having dopants of a second conductivity type.

11. The method of claim 10, further comprising forming a source region in the outer well, the source region having dopants of the first conductivity type.

12. The method of claim 10, further comprising a gate structure overlying portions of the outer well and the high voltage well.

13. The method of claim 10, further comprising forming a guard ring in the outer well, the guard ring having a higher concentration of the second conductivity type than the outer well.

14. A method of forming a semiconductor device, the method comprising:
    forming a first doped region in a substrate, the first doped region having a first concentration of dopants of a first conductivity type;
    forming a plurality of second doped regions in the first doped region, the second doped regions having a second concentration of the first conductivity type, the second concentration being greater than the first concentration, the plurality of second doped regions being separated from each other; and
    forming one or more contacts over different ones of the plurality of second doped regions.

15. The method of claim 14, forming a third doped region of the first conductivity type, wherein the first doped region is in the third doped region.

16. The method of claim 15, forming a fourth doped region spaced apart from the third doped region, the fourth doped region having dopants of a second conductivity type.

17. The method of claim 16, forming a fifth doped region of the first conductivity type and a sixth doped region of the second conductivity type within the fourth doped region.

18. The method of claim 17, further comprising forming a dielectric region between the fifth doped region and the sixth doped region.

19. The method of claim 16, further comprising forming a gate structure, at least portions of the gate structure overlying the third doped region and the fourth doped region.

20. The method of claim 14, further comprising forming oxide regions at least partially overlying the first doped region.

* * * * *